US009673753B1

(12) United States Patent
Yildirim et al.

(10) Patent No.: US 9,673,753 B1
(45) Date of Patent: Jun. 6, 2017

(54) VOLTAGE-CONTROLLED OSCILLATOR WITH IMPROVED TUNING CURVE LINEARIZATION

(71) Applicant: Cavium, Inc., San Jose, CA (US)

(72) Inventors: Omer O. Yildirim, Marlborough, MA (US); JingDong Deng, Acton, MA (US); Scott E. Meninger, Groton, MA (US)

(73) Assignee: CAVIUM, INC., San Jose, CA (US)

( * ) Notice: Subject to any disclaimer, the term of this patent is extended or adjusted under 35 U.S.C. 154(b) by 0 days.

(21) Appl. No.: 15/000,840

(22) Filed: Jan. 19, 2016

(51) Int. Cl.
*H03B 5/08* (2006.01)
*H03B 5/12* (2006.01)

(52) U.S. Cl.
CPC .......... *H03B 5/1212* (2013.01); *H03B 5/124* (2013.01); *H03B 5/1243* (2013.01); *H03B 5/1246* (2013.01); *H03B 5/1265* (2013.01)

(58) Field of Classification Search
CPC ........ H03B 1/00; H03B 5/1212; H03B 5/124; H03B 5/1243; H03B 5/1265; H03B 5/1246
USPC .......... 331/167, 117 R, 117 FE, 177 V, 36 C, 331/185
See application file for complete search history.

(56) References Cited

U.S. PATENT DOCUMENTS

| | | | | |
|---|---|---|---|---|
| 7,102,454 B2* | 9/2006 | Sze | ...................... | H03C 3/0958 331/117 FE |
| 8,098,110 B2* | 1/2012 | Yang | ...................... | H03L 1/023 331/175 |
| 8,604,889 B2* | 12/2013 | Duperray | ............. | H03B 5/1278 331/117 FE |
| 8,803,616 B2* | 8/2014 | Zhang | ...................... | H03L 1/02 331/115 |
| 2005/0030116 A1* | 2/2005 | Takagi | ................. | H03B 5/1228 331/177 V |
| 2007/0146082 A1* | 6/2007 | Ohara | .................... | H03L 7/099 331/16 |

OTHER PUBLICATIONS

VCXO Tuning Slope (Kv), Stability, and Absolute Pull Range (APR), *Silicon Labs*, AN266, Rev. 0.2 (2010).

* cited by examiner

*Primary Examiner* — Arnold Kinkead
(74) *Attorney, Agent, or Firm* — Hamilton, Brook, Smith & Reynolds, P.C.

(57) ABSTRACT

In an embodiment, a voltage-controlled oscillator circuit includes a gain element and an LC resonator coupled with the gain element, the LC resonator including an inductor section and a capacitor section. The capacitor section has at least two branches connected in parallel and a voltage control input for tuning the LC resonator. Any of the at least two branches is selected from the group of DC-coupled and AC-coupled. Characteristics of the two branches and bias voltages of the AC-coupled branches are selected to provide a tuning curve of the voltage-controlled oscillator circuit that is approximately linear.

11 Claims, 3 Drawing Sheets

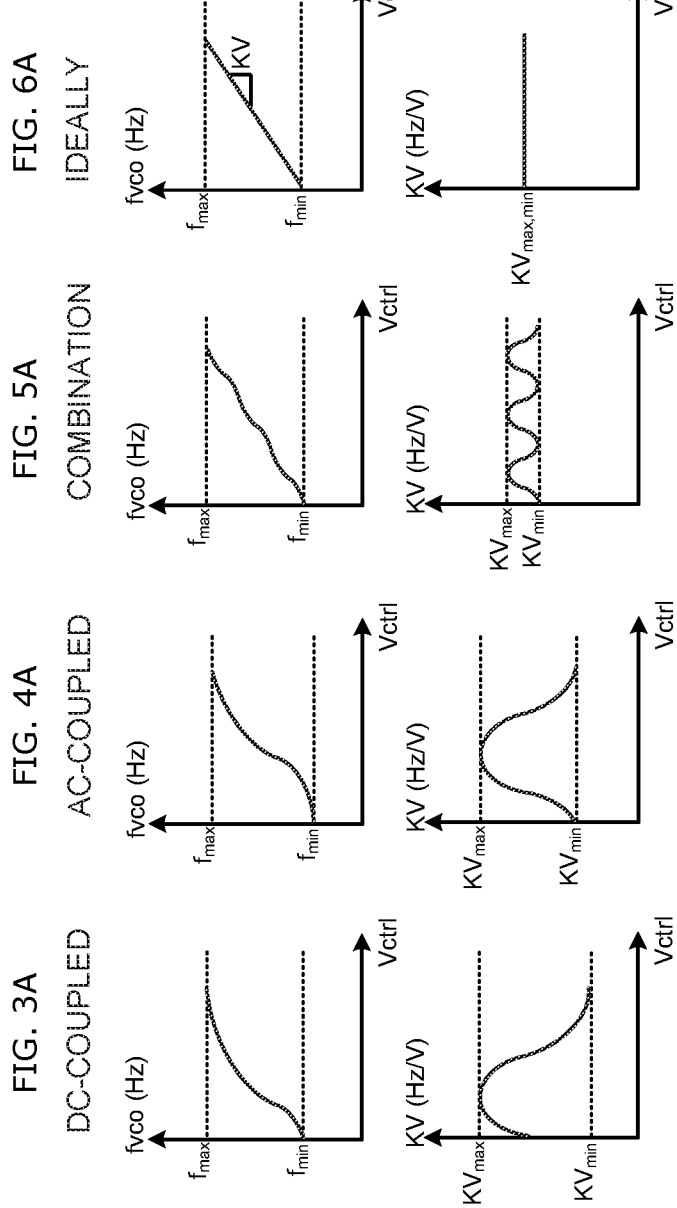

VOLTAGE-CONTROLLED OSCILLATOR WITH IMPROVED TUNING CURVE LINEARIZATION

BACKGROUND

A voltage-controlled oscillator (VCO) is a device typically used in phase-locked loop (PLL) circuits to provide an output clock signal that is phase locked to a reference clock signal. The VCO has an output frequency that can be adjusted by varying a control voltage input. The voltage-to-frequency gain, also referred to as tuning slope, of the VCO specifies the amount of frequency change that results from a given change in the control voltage. The tuning slope is typically represented by the symbol "Kv" and expressed in units of Hz/V. In an ideal VCO, the tuning curve is linear and the tuning slope is constant. VCO devices that are of the inductor-capacitor (LC) type have generally non-linear curves of output frequency versus control voltage due to the non-linear characteristics of the varactors used in the LC-VCO.

SUMMARY

An LC-VCO with a linearized tuning curve is desirable because such a device is easier to control in a PLL.

Accordingly, a voltage-controlled oscillator circuit includes a gain element and an LC resonator coupled with the gain element, the LC resonator including an inductor section and a capacitor section. The capacitor section has at least two branches connected in parallel and a voltage control input for tuning the LC resonator. Any of the at least two branches is selected from the group of DC-coupled and AC-coupled.

In an embodiment, the voltage-controlled oscillator circuit has one DC-coupled branch and one AC-coupled branch.

In another embodiment, the voltage-controlled oscillator circuit includes at least two AC-coupled branches. Each AC-coupled branch comprises a first coupling capacitor connected in series to a first end of a first varactor, a second end of the first varactor connected in series to a first end of a second varactor, a second end of the second varactor connected in series to a second coupling capacitor, a first resistor connected between a bias voltage and a first node between the first coupling capacitor and the first end of the first varactor, a second resistor connected between the bias voltage and a second node between the second coupling capacitor and the second end of the second varactor. The voltage control input is connected to a node between the first varactor and the second varactor.

The bias voltages may be different for each AC-coupled branch in order to provide a more linear tuning curve.

The bias voltage for each AC-coupled branch may be selected to provide a tuning curve of the voltage-controlled oscillator circuit that is approximately linear.

A characteristic of the first varactor and second varactor may be different for at least one of the at least two AC-coupled branches.

A characteristic of the first varactor and second varactor for each of the at least two AC-coupled branches may be selected to provide a tuning curve of the voltage-controlled oscillator circuit that is approximately linear.

In another embodiment, the voltage-controlled oscillator circuit includes at least two DC-coupled branches. Each DC-coupled branch comprises a pair of varactors connected in series, the voltage control input connected to a node between the pair of varactors, wherein a characteristic of the pair of varactors is different for at least one of the at least two DC-coupled branches.

A characteristic of the pair of varactors for each of the at least two DC-coupled branches may be selected to provide a tuning curve of the voltage-controlled oscillator circuit that is approximately linear.

In an embodiment, the voltage-controlled oscillator circuit may include a current source coupled to the LC resonator.

In an embodiment, the gain element of the voltage-controlled oscillator circuit is a cross-coupled transistor pair.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIGS. 3A and 3B illustrate output frequency versus control voltage and tuning slope versus control voltage, respectively, for a typical DC-coupled LC resonator.

FIGS. 4A and 4B illustrate output frequency versus control voltage and tuning slope versus control voltage, respectively, for a typical AC-coupled LC resonator.

FIGS. 5A and 5B illustrate output frequency versus control voltage and tuning slope versus control voltage, respectively, for an LC resonator that combines AC-coupled and DC-coupled elements in accordance with example embodiments.

FIGS. 6A and 6B illustrate output frequency versus control voltage and tuning slope versus control voltage, respectively, for an ideal LC resonator.

DETAILED DESCRIPTION

A description of example embodiments of the invention follows.

Figure 1:
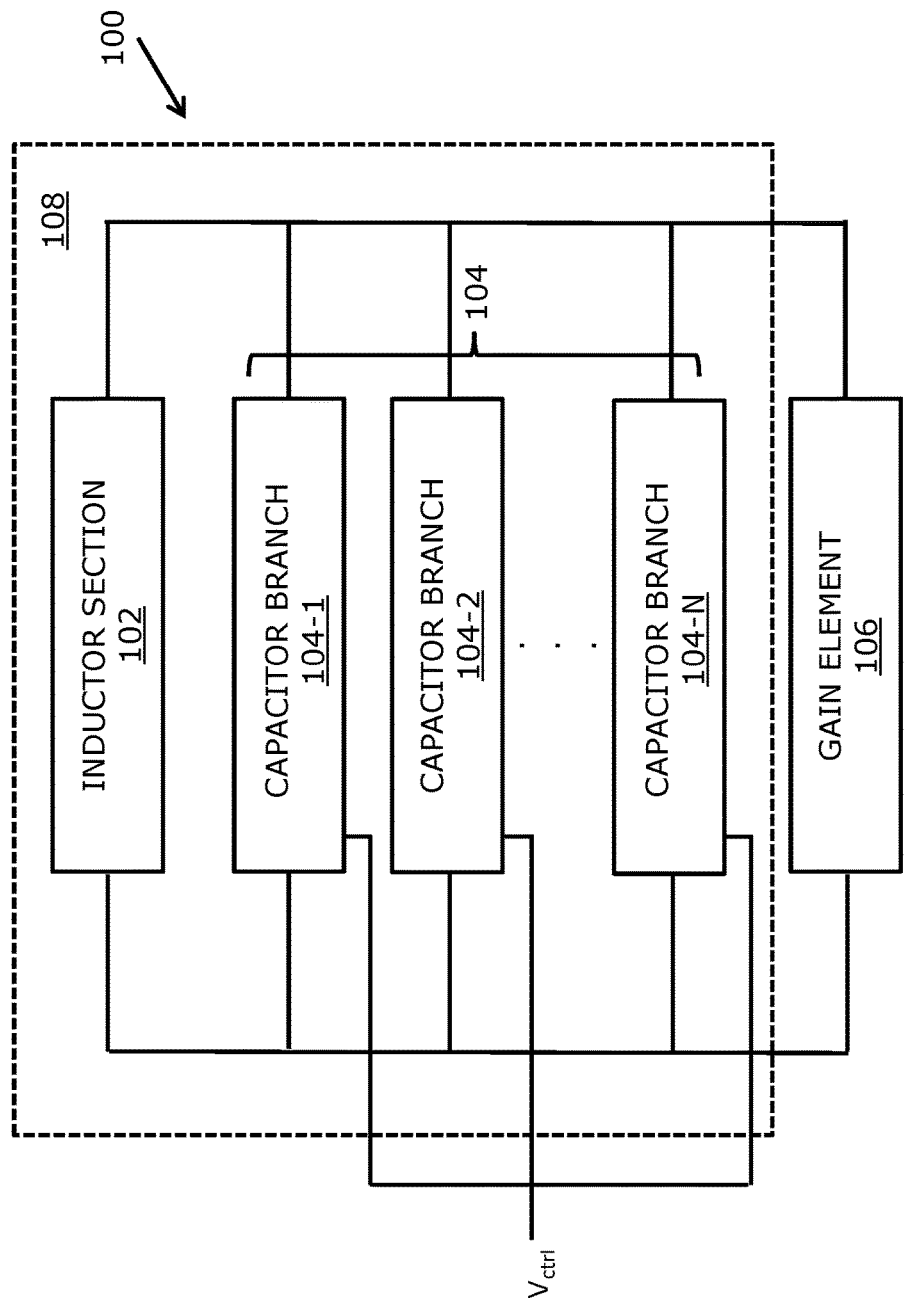
FIG. 1 is a block diagram of an example embodiment of a voltage-controlled oscillator circuit.

FIG. 1 is a block diagram of an example embodiment of a voltage-controlled oscillator circuit 100 which illustrates principles of the present approach. The voltage-controlled oscillator circuit 100 includes a gain element 106 and an LC resonator 108 coupled with the gain element. The LC resonator 108 including an inductor section 102 and a capacitor section 104.

While the block diagram shows the inductor section 102 and capacitor section 104 coupled in parallel, in some embodiments the inductor section 102 and capacitor section 104 may be coupled in series.

The gain element 106 may be, for example, a cross-coupled transistor or other active element or elements. While the block diagram shows the LC resonator 108 coupled in parallel with the gain element 106, in some embodiments the LC resonator 108 may be coupled to the gain element 106 in series.

In some embodiments, a current source may be coupled to the voltage-controlled oscillator circuit 100.

The capacitor section 104 has at least two capacitor branches 104-1, 104-2, ..., 104-N connected in parallel and a voltage control input $V_{cat}$ for tuning the LC resonator 108.

Any of the at least two capacitor branches 104-1, 104-2, . . . , 104-N is selected from the group of DC-coupled and AC-coupled. Characteristics of the two capacitor branches 104-1, 104-2, . . . , 104-N are selected to provide a tuning curve of the voltage-controlled oscillator circuit that is approximately linear as described further herein.

Figure 2:
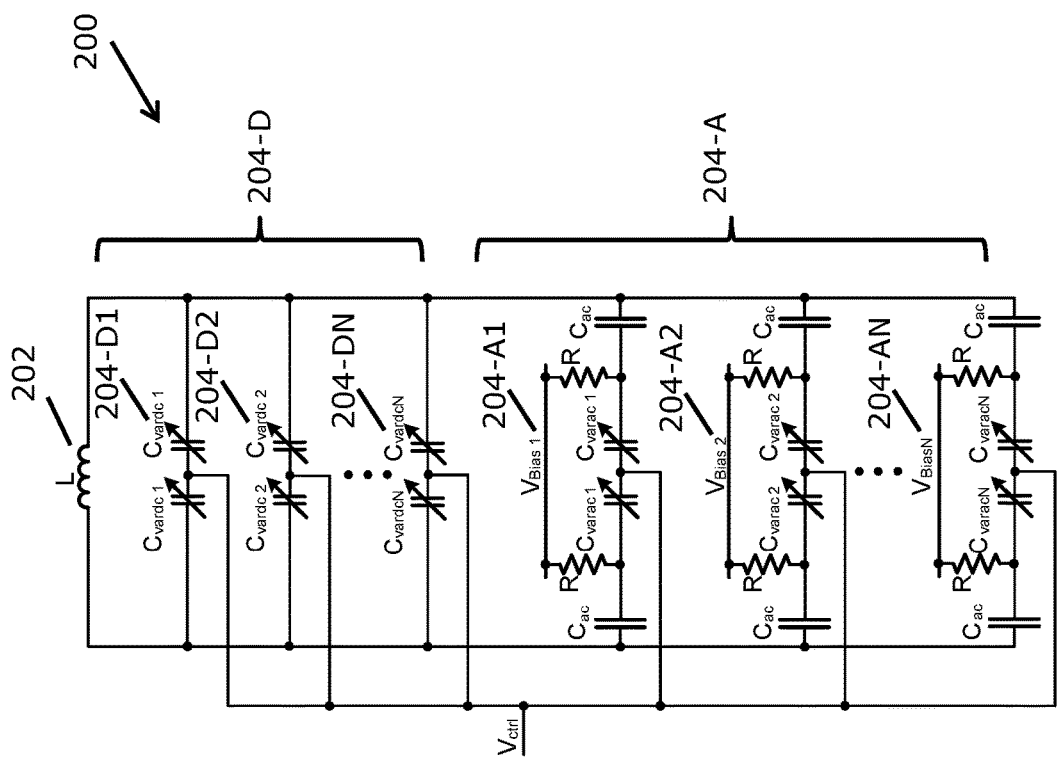
FIG. 2 illustrates a circuit block diagram of an example embodiment of an LC resonator.

FIG. 2 illustrates a circuit block diagram of an example embodiment of an LC resonator 200. The LC resonator 200 includes an inductor section 202 and capacitor sections 204-D and 204-A. A voltage control input $V_{cat}$ is coupled to the LC resonator 200 for tuning.

The capacitor section 204-D has one or more DC-coupled branches 204-D1, 204-D2, 204-DN connected in parallel. Each DC-coupled branch in capacitor section 204-D includes a pair of varactors $C_{vardc}$ connected in series, with the voltage control input $V_{ctrl}$ connected to a node between the pair of varactors.

The capacitance of a varactor is controlled by the voltage applied across the varactor. Consequently, a varactor can be used to change the capacitance, and hence the frequency, of an LC resonator. A characteristic of the pair of varactors $C_{vardc}$ may be different for at least one of the DC-coupled branches. For example, the varactor pair $C_{vardc1}$ of DC-coupled branch 204-D1 may have a different characteristic than that of the varactor pair $C_{vardc2}$ of DC-coupled branch 204-D2 and/or the varactor pair $C_{vardcN}$ of DC-coupled branch 204-DN.

The capacitor section 204-A has one or more AC-coupled branches 204-A1, 204-A2, . . . , 204-AN connected in parallel. Each AC-coupled branch in capacitor section 204-A includes a pair of coupling capacitors $C_{AC}$, a pair of varactors $C_{varac}$ and a pair of resistors R. A first coupling capacitor of the pair of coupling capacitors $C_{AC}$ is connected in series to one end of a first varactor of the pair of varactors $C_{varac}$, the other end of the first varactor is connected in series to one end of a second varactor of the pair of varactors $C_{varac}$, and the other end of the second varactor is connected in series to a second coupling capacitor of the pair of coupling capacitors $C_{AC}$. A first resistor of the pair of resistors R is connected between a bias voltage $V_{BIAS}$ and a first node between the first coupling capacitor and the first end of the first varactor. A second resistor of the pair of resistors R is connected between the bias voltage $V_{BIAS}$ and a second node between the second coupling capacitor and the second end of the second varactor. The voltage control input $V_{ctrl}$ is connected to a node between the first varactor and the second varactor.

The bias voltage $V_{BIAS}$ may be different for each AC-coupled branch. For example, the bias voltage $V_{BIAS1}$ of AC-coupled branch 204-A1 may be different than the bias voltage $V_{BIAS2}$ of AC-coupled branch 204-A2 and/or the bias voltage $V_{BIASN}$ of AC-coupled branch 204-AN.

A characteristic of the pair of varactors $C_{varac}$ may be different for at least one of the AC-coupled branches. For example, the varactor pair $C_{varac1}$ of AC-coupled branch 204-A1 may have a different characteristic than that of the varactor pair $C_{varac2}$ of AC-coupled branch 204-A2 and/or the varactor pair $C_{varacN}$ of AC-coupled branch 204-AN.

It should be understood that, while the embodiment described in connection with FIG. 2 is shown having one or more DC-coupled branches and one or more AC-coupled branches, in some embodiments there may be two or more DC-coupled branches and no AC-coupled branches and in other embodiments there may be two or more AC-coupled branches and no DC-coupled branches.

The voltage-to-frequency gain, also referred to as tuning slope, of the VCO specifies the amount of frequency change that results from a given change in the control voltage. The tuning slope is typically represented by the symbol "Kv" and expressed in units of Hz/V. VCO devices that have LC resonators generally feature non-linear curves of output frequency versus control voltage due to the non-linear characteristics of the varactors used in the LC-VCO.

FIGS. 6A and 6B illustrate output frequency versus control voltage and tuning slope versus control voltage, respectively, for an ideal LC resonator. As shown in FIG. 6A, the ideal curve for output frequency versus control voltage is linear, resulting in an ideal tuning slope versus control voltage in FIG. 6B that is flat.

FIGS. 3A and 3B illustrate output frequency versus control voltage and tuning slope versus control voltage, respectively, for a typical DC-coupled LC resonator. As can be seen from FIG. 3A, the output frequency versus control voltage for the DC-coupled LC resonator is non-linear. In FIG. 3B, the Kv curve for the typical DC-coupled LC resonator is characterized by a non-linear curve that has a maximum Kv value at relatively low control voltage and slopes toward a minimum Kv value at relatively high control voltage.

FIGS. 4A and 4B illustrate output frequency versus control voltage and tuning slope versus control voltage, respectively, for a typical AC-coupled LC resonator. As can be seen from FIG. 4A, the output frequency versus control voltage for the AC-coupled LC resonator is non-linear. In FIG. 4B, the Kv curve for the typical AC-coupled LC resonator is characterized by a non-linear curve that has a maximum Kv value at relatively mid control voltage and slopes toward minimum Kv values at relatively low and high control voltages.

By selecting combinations of DC-coupled and AC-coupled capacitor branches, for example, as shown in FIG. 2, the output frequency versus control voltage curve can be shaped to improve linearity so as to approach the ideal noted with respect to FIG. 6A. In addition, the linearization is further improved by selecting differing characteristics for the varactors used within the combinations of DC-coupled and AC-coupled capacitor branches.

FIGS. 5A and 5B illustrate output frequency versus control voltage and tuning slope versus control voltage, respectively, for an LC resonator that combines AC-coupled and DC-coupled elements in accordance with example embodiments based on the circuitry of FIG. 2.

While this invention has been particularly shown and described with references to example embodiments thereof, it will be understood by those skilled in the art that various changes in form and details may be made therein without departing from the scope of the invention encompassed by the appended claims.

What is claimed is:
1. A voltage-controlled oscillator circuit comprising:
  a gain element;
  an LC resonator coupled with the gain element, the LC resonator including an inductor section and a capacitor section, the capacitor section having at least two branches connected in parallel and an analog voltage control input coupled to the at least two branches for tuning the LC resonator to adjust an output frequency of the VCO, wherein at least one branch of the at least two branches is DC-coupled, at least one other branch of the at least two branches is AC-coupled and any of the remaining branches of the at least two branches is selected from the group of DC-coupled and AC-coupled, wherein an analog voltage control signal applied to the analog voltage control input is received by each branch.

2. The voltage-controlled oscillator circuit of claim 1, wherein the at least two branches comprise one DC-coupled branch and one AC-coupled branch.

3. The voltage-controlled oscillator circuit of claim 1, wherein the remaining branches of the at least two branches comprise at least two AC-coupled branches, each AC-coupled branch comprising a first coupling capacitor connected in series to a first end of a first varactor, a second end of the first varactor connected in series to a first end of a second varactor, a second end of the second varactor connected in series to a second coupling capacitor, a first resistor connected between a bias voltage and a first node between the first coupling capacitor and the first end of the first varactor, a second resistor connected between the bias voltage and a second node between the second coupling capacitor and the second end of the second varactor, the voltage control input connected to a node between the first varactor and the second varactor.

4. The voltage-controlled oscillator circuit of claim 3, wherein the bias voltage is different for at least one of the at least two AC-coupled branches.

5. The voltage-controlled oscillator circuit of claim 3, wherein the bias voltage for each of the at least two AC-coupled branches is selected to provide a tuning curve of the voltage-controlled oscillator circuit that is approximately linear.

6. The voltage-controlled oscillator circuit of claim 3, wherein a characteristic of the first varactor and second varactor is different for at least one of the at least two AC-coupled branches.

7. The voltage-controlled oscillator circuit of claim 3, wherein a characteristic of the first varactor and second varactor for each of the at least two AC-coupled branches is selected to provide a tuning curve of the voltage-controlled oscillator circuit that is approximately linear.

8. The voltage-controlled oscillator circuit of claim 1, wherein the at least two branches comprise at least two DC-coupled branches, each DC-coupled branch comprising a pair of varactors connected in series, the voltage control input connected to a node between the pair of varactors, wherein a characteristic of the pair of varactors is different for at least one of the at least two DC-coupled branches.

9. The voltage-controlled oscillator circuit of claim 8, wherein the characteristic of the pair of varactors for each of the at least two DC-coupled branches is selected to provide a tuning curve of the voltage-controlled oscillator circuit that is approximately linear.

10. The voltage-controlled oscillator circuit of claim 1, further comprising a current source coupled to the LC resonator.

11. The voltage-controlled oscillator circuit of claim 1, wherein the gain element comprises a cross-coupled transistor pair.

* * * * *